(12) United States Patent
Birnstock et al.

(10) Patent No.: US 7,781,961 B2
(45) Date of Patent: Aug. 24, 2010

(54) TOP EMITTING, ELECTROLUMINESCENT COMPONENT WITH FREQUENCY CONVERSION CENTRES

(75) Inventors: Jan Birnstock, Dresden (DE); Martin Vehse, Dresden (DE); Karl Leo, Dresden (DE)

(73) Assignee: Novaled AG, Dresden (DE)

( * ) Notice: Subject to any disclaimer, the term of this patent is extended or adjusted under 35 U.S.C. 154(b) by 612 days.

(21) Appl. No.: 11/574,419

(22) PCT Filed: Aug. 30, 2005

(86) PCT No.: PCT/DE2005/001515

§ 371 (c)(1),
(2), (4) Date: Mar. 22, 2007

(87) PCT Pub. No.: WO2006/024278

PCT Pub. Date: Mar. 9, 2006

(65) Prior Publication Data

US 2009/0051271 A1 Feb. 26, 2009

(30) Foreign Application Priority Data

Aug. 31, 2004 (DE) .................. 10 2004 042 461

(51) Int. Cl.
*H05B 33/04* (2006.01)
(52) U.S. Cl. ........................... 313/506; 313/504
(58) Field of Classification Search ......... 313/498–512; 428/690

See application file for complete search history.

(56) References Cited

U.S. PATENT DOCUMENTS 5,150,006 A * 9/1992 Van Slyke et al. ........... 313/504

(Continued)

FOREIGN PATENT DOCUMENTS

DE 19625622 1/1998

(Continued)

OTHER PUBLICATIONS

Resch-Genger et al., "Quantum dots versus organic dyes as fluorescent labels", 2008, Nature Methods, vol. 5 No. 9, pp. 763-776.*

(Continued)

*Primary Examiner*—Nimeshkumar D Patel
*Assistant Examiner*—Anne M Hines
(74) *Attorney, Agent, or Firm*—Sutherland, Asbill & Brennan, LLP

(57) ABSTRACT

In order, in the case of an OLED, to improve the coupling-out efficiency, a top emitting electroluminescent component (100) is proposed, comprising a substrate (110), a first electrode (120) closest to the substrate, a transparent electrode (140) located at a distance from the substrate, and at least one light-emitting organic layer (130) arranged between the two electrodes. The component according to the invention is distinguished by the fact that a coupling-out layer (150) is arranged on that side of the second electrode which is remote from the at least one organic layer, said coupling-out layer comprising conversion centres (151) which partly absorb the light emitted by the at least one organic layer and emit it again with an altered frequency. In this way, directional light penetrating into the coupling-out layer is emitted again in non-directional fashion, so that a part of the light which would be captured by means of total reflection without the influence of the frequency conversion centres within the coupling-out layer can indeed leave the coupling-out layer.

14 Claims, 2 Drawing Sheets

U.S. PATENT DOCUMENTS

Figure 1:
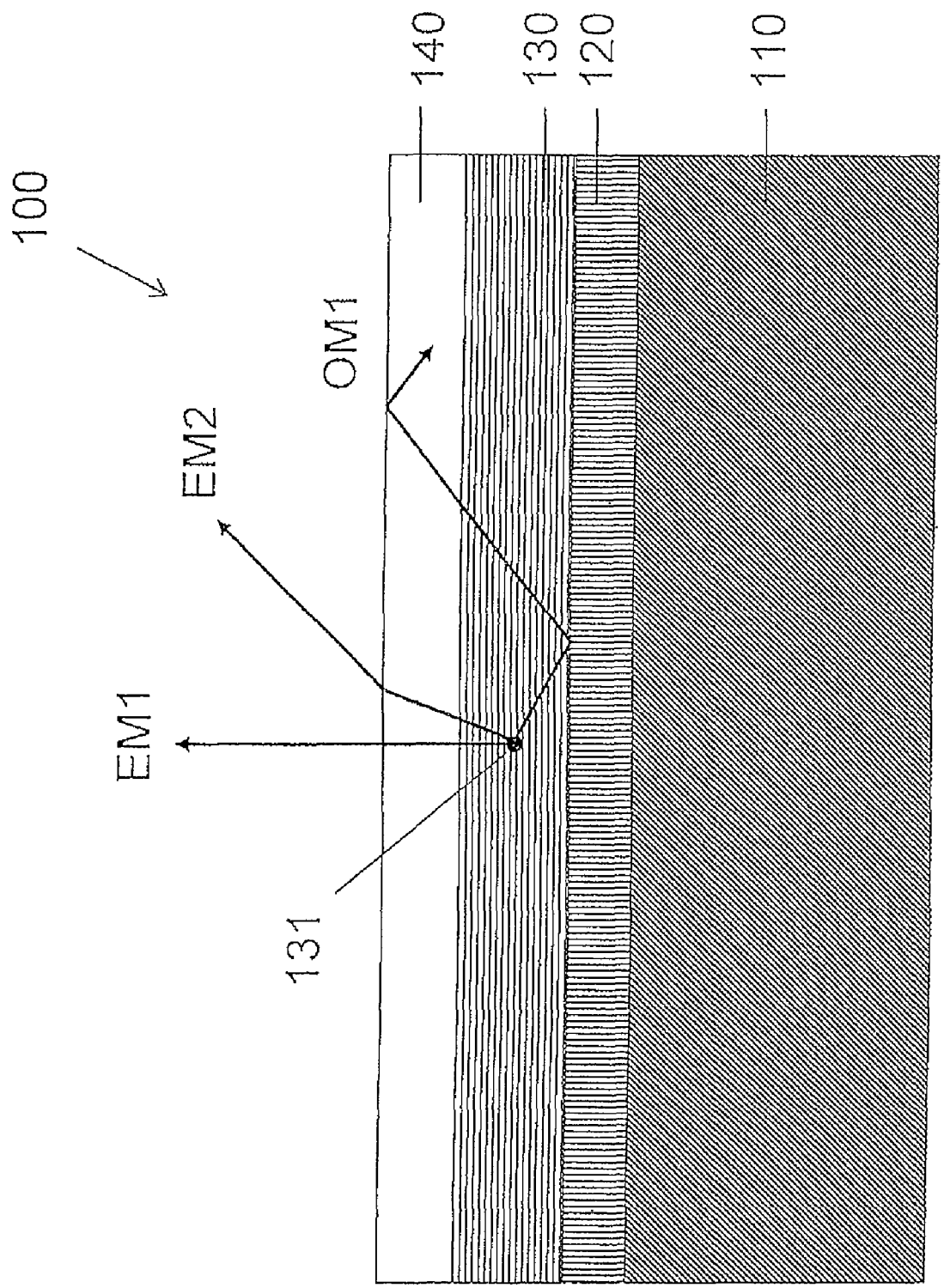

| | | | |
|---|---|---|---|
| 6,356,032 B1 | 3/2002 | Suzuki et al. | |
| 6,476,550 B1 | 11/2002 | Oda et al. | |
| 6,630,684 B2 | 10/2003 | Lee | |
| 6,717,358 B1 * | 4/2004 | Liao et al. | 313/504 |
| 6,878,297 B1 | 4/2005 | Berger | |
| 6,885,025 B2 * | 4/2005 | Tung et al. | 257/40 |
| 6,965,197 B2 | 11/2005 | Tyan | |
| 7,012,363 B2 | 3/2006 | Weaver | |
| 7,101,626 B1 * | 9/2006 | Frob et al. | 428/446 |
| 7,256,541 B2 | 8/2007 | Birnstock | |
| 2001/0026124 A1 | 10/2001 | Liu et al. | |
| 2001/0033135 A1 | 10/2001 | Duggal et al. | |
| 2001/0035713 A1 | 11/2001 | Kimuea | |
| 2001/0038102 A1 | 11/2001 | Kawase | |
| 2001/0055841 A1 | 12/2001 | Yamazaki et al. | |
| 2002/0015807 A1 | 2/2002 | Sugino et al. | |
| 2002/0084993 A1 | 7/2002 | Teneya | |
| 2002/0180372 A1 | 12/2002 | Yamazaki et al. | |
| 2003/0062636 A1 | 4/2003 | Chen | |
| 2003/0111666 A1 | 6/2003 | Nishi et al. | |
| 2003/0111955 A1 | 6/2003 | McNulty et al. | |
| 2003/0127973 A1 | 7/2003 | Weaver et al. | |
| 2003/0146443 A1 | 8/2003 | Yamazaki et al. | |
| 2003/0164679 A1 | 9/2003 | Hamano et al. | |
| 2004/0012980 A1 | 1/2004 | Sigiura et al. | |
| 2004/0021434 A1 | 2/2004 | Yoneda et al. | |
| 2004/0066824 A1 | 4/2004 | Magno | |
| 2004/0109328 A1 | 6/2004 | Dahl et al. | |
| 2004/0135502 A1 | 7/2004 | Kobayashi et al. | |
| 2004/0183963 A1 | 9/2004 | Nakamura et al. | |
| 2004/0227446 A1 | 11/2004 | Fujimoto et al. | |
| 2005/0118745 A1 | 6/2005 | Yamazaki et al. | |
| 2005/0142379 A1 | 6/2005 | Juni et al. | |
| 2006/0033115 A1 | 2/2006 | Blochwitz et al. | |
| 2006/0152150 A1 | 7/2006 | Boerner et al. | |
| 2006/0175960 A1 | 8/2006 | Noh et al. | |
| 2007/0035236 A1 | 2/2007 | Murano et al. | |
| 2008/0048557 A1 | 2/2008 | Birnstock et al. | |

FOREIGN PATENT DOCUMENTS

| | | | |
|---|---|---|---|
| DE | 3804293 | | 8/1998 |
| DE | 19836943 | | 4/2000 |
| GB | 2361356 | | 10/2001 |
| GB | 2390215 | | 12/2003 |
| WO | WO 0162868 A1 * | | 8/2001 |
| WO | 02/37580 | | 5/2002 |
| WO | 2004/086462 | | 10/2004 |

OTHER PUBLICATIONS

Carter, S. A. et al., "Enhanced luminance in polymer composite light emitting devices," Appl. Phys. Lett., vol. 71, pp. 1145-1147, Sep. 1997.

Froeb, H. et al., "Extremely high quantum efficiencies from organic dyes in inorganic matrix layers," Proceedings of the 1998 Conference on Lasers and Electro-optics, CLEO; San Francisco, CA, USA, May 3-8, 1998, pp. 210-211.

Lupton, J. M. et al., "Bragg scattering from periodically microstructured light emitting diodes," Appl. Phys. Lett., vol. 77, pp. 3340-3342, Nov. 2000.

Madigan, C.F. "Improvement of Output coupling efficiency of organic light emitting diodes by backside substrate modification," Appl. Phys. Lett., vol. 76, pp. 1650-1652, Mar. 2000.

Pfeiffer, M, et al., "Doped Organic semiconductors: physics and application in light emitting diodes," Organic Electronics, Elsevier, Amsterdam. NL, vol. 4, No. 2/3, Sep. 2003, pp. 89-103, XP001177135, ISSN: 1556-1199.

Schnitzer, J., "30% External Quantum Efficiency from Surface Textured, Thin-film Light emitting diodes," Applied Phys. Lett., vol. 63, pp. 2174-2176, Oct. 1993.

Yamasaki, T. et al., "Organic Light emitting device with an ordered monolayer of silica microspheres as a scattering medium," Appl. Phys. Lett., vol. 76, pp. 1243-1245, Mar. 2000.

Notice of Allowance, U.S. Appl. No. 11/463,697 (May 13, 2009).

Non-Final Office Action, U.S. Appl. No. 11/463,697 (Dec. 15, 2008).

Search Report for EP 1753048; Feb. 2, 2006.

Search Report for PCT/DE2005/001229; Oct. 19, 2006.

Non-final Rejection, U.S. Appl. No. 11/572,458, (Apr. 24, 2009).

International Search Report for PCT/EP2007/000208, Apr. 10, 2007.

Final Office Action; U.S. Appl. No. 11/572,458; (Dec. 16, 2009).

Response to Office Action: U.S. Appl. No. 11/572,458; Aug. 24, 2009.

Response to Office Action; U.S. Appl. No. 11/463,697; Apr. 15, 2009.

Disclosure Under 37 CFR 1 56 (submitted herewith).

Bernanose, Andre et al. "Sur un nouvea mode d'emission lumineuse chez certains composes organiques," J. de Chimie Physique, 1953, No. 1, pp. 64-68.

Gu, G., et al. "Transparent stacked organic light emitting devices. I. Design principles and transparent compound electrodes," Journal of Applied Physics, 1999, vol. 86, No. 8, pp. 4067-4075.

Hong, Il-Hwa et al. "Effective hole injection of organic light-emitting diodes by introducing buckminsterfullerene on the indium tin oxide anode," Applied Physics Letters, 2005, 87, 063502-1.

* cited by examiner

TOP EMITTING, ELECTROLUMINESCENT COMPONENT WITH FREQUENCY CONVERSION CENTRES

The invention relates to a top emitting, electroluminescent component and to a method for producing it.

BACKGROUND OF THE INVENTION

In recent years a high demand has developed for ever smaller, space-saving, light and cost-effective display modules and displays for fast and adequate visualization of data. In the field of flat screens for notebooks, mobile telephones and digital cameras, LCDs (liquid crystal displays) are still predominant at the present time. However, they have some disadvantages, such as the great angular dependence of contrast and colours, slow response times in the event of picture and contrast change, and a low efficiency caused by a multiplicity of filters and polarizers, so that comparatively high energies have to be used for obtaining the required luminous intensity. In this respect, there is a high demand for small high-resolution and power-saving screens with improved presentation properties. Displays based on organic light-emitting diodes (OLEDs) represent an alternative to LCDs since they themselves comprise light-emitting pixels and, consequently, do not have any backlighting. They can be produced in the form of a film, for example, flexibly and thin with low production costs and can be operated with a comparatively low expenditure of energy. With their low operating voltage, the high energy efficiency and also the possibility of producing planar emitting components for the emission of any desired colours, OLEDs are also suitable for application in illumination elements.

OLEDs are based on the principle of electroluminescence, in which electron-hole pairs, so-called excitons, recombine with emission of light. For this purpose, the OLED is constructed in the form of a sandwich structure in which at least one organic film is arranged as active material between two electrodes, positive and negative charge carriers being injected into the organic material, a charge transport of holes or electrons to a recombination zone in the organic layer taking place, where a recombination of the charge carriers to form singlet and/or triplet excitons occurs. The subsequent radiative decomposition of the excitons causes the emission of visible useful light that is emitted by the light-emitting diode. In order that this light can leave the component, at least one of the electrodes must be transparent. This transparent electrode is generally composed of conductive oxides, referred to as TCOs (transparent conductive oxides). The starting point in the production of an OLED is a substrate, to which the individual layers of the OLED are applied. If the electrode nearest to the substrate is transparent, the component is referred to as a "bottom emission OLED"; if the other electrode is embodied in transparent fashion, the component is referred to as a "top emission OLED". The same applies to the case of fully transparent OLEDs, in which both the electrode between the substrate and the at least one organic layer and the electrode located at a distance from the substrate are embodied in transparent fashion.

As explained, light is generated in the active zone or emission zone of the component through radiative recombination of electrons and defect electrons (holes) by means of excitonic states. The different layers of the OLEDs, for example the transparent electrodes and the at least one organic layer, generally have a different refractive index, which is naturally greater than 1. In this respect, not all of the photons generated can leave the component and be perceived as light since total reflections can occur at the various interfaces within the component or between the component and air. Moreover, a part of the light generated is also absorbed again within the component. Depending on the design of the OLEDs, besides propagation of external modes, on account of the total reflection described above, optical substrate and/or organic modes form (that is to say propagation of light in the substrate, the transparent electrode and/or the at least one organic layer). If the electrode nearest to the substrate is not transparent (top emission OLED), besides external modes it is merely possible for modes to propagate in the at least one organic layer and/or the electrode located at a distance from the substrate, which are referred to jointly as organic modes. Only the external optical modes can be perceived as light by the observer, that proportion of the total luminescence generated within the component which is made up by said modes being approximately 20%, depending on the design of the OLED. In this respect, there is a need to couple these internal optical modes, that is to say organic and, if appropriate, substrate modes, out of the component to a greater extent in order to achieve a highest possible efficiency of the organic light-emitting component.

In order to improve the coupling-out efficiency, a multiplicity of methods and configurations, particularly for bottom emitting OLEDs, are known which are concerned with the coupling-out of the optical substrate modes. For this purpose, the article "30% external quantum efficiency from surface textured, thin-film light-emitting diodes" by I. Schnitzer, Appl. Phys. Lett., Volume 63, page 2174 (1993), proposes roughening the surface of the substrate, whereby the occurrence of total reflection at the interface between substrate and air is avoided to a considerable extent. This roughening may be achieved for example by etching or sandblasting the substrate area remote from the organic portion. The paper "Improvement of output coupling efficiency of organic light-emitting diodes by backside substrate modification", by C. F. Madigan, Appl. Phys. Lett., Volume 76, page 1650 (2000), describes applying a spherical pattern to the rear side of the substrate surface. Said pattern may comprise an array of lenses, for example, which is applied to the substrate by adhesive bonding or lamination. The article "Organic light emitting device with an ordered monolayer of silica microspheres as a scattering medium" by T. Yamasaki et al., Appl. Phys. Lett., Volume 76, page 1243 (2000), proposes applying microspheres made of quartz glass to the surface of the substrate in order to improve the coupling-out of light in the case of an OLED. Said microspheres may also be arranged beside the OLED. Furthermore, it is also known to produce periodic strictures having a period length in the region of the wavelength of the light emitted by the OLED between substrate and first electrode, said periodic structure continuing into the optically active layer of the light-emitting diode. The geometry specified ultimately results in Bragg scattering that increases the efficiency of the component, see J. M. Lupton et al., Appl. Phys. Lett., Vol. 77, page 3340 (2000). The published German patent application DE 101 64 016 A1 furthermore relates to an organic light-emitting diode in which the at least one organic layer has different partial regions having different refractive indices. On account of the deflection at the phase boundaries within the organic portion, fewer photons remain captured as a result of wave-guiding losses in the layer than in the case of homogeneous layers.

In addition to this utilization of intrinsic inhomogeneities in the active organic layer, it is furthermore known to introduce impurities such as nanoparticles to the organic electroluminescent material, thus making it possible to avoid waveguide effects within the organic portion, see for example "Enhanced luminance in polymer composite light emitting devices", by S. A. Carter et al., Appl. Phys. Lett., Vol. 71 (1997). Said nanoparticles may be composed for example of $TiO_2$, $SiO_2$ or $Al_2O_3$ and be embedded in a polymeric emitter material, such as MEH-PPV.

In addition to bottom emitting OLEDs, top emitting OLEDs are increasingly gaining in relevance since they have advantages over the former for specific applications. If both the two electrodes and the substrate are transparent, it is possible to provide an electroluminescent component which emits in its entirety, that is to say towards the top and bottom. If the substrate does not have to be transparent as in a top emitting OLED, besides glass it is also possible to use many other substrates which make it possible, for example, for the component to be flexible, that is to say pliable. Furthermore, metal foils, silicon wafers or other substrates with silicon-based electronic components and also printed circuit boards may also serve as substrates in a top emitting electroluminescent component of this type.

SUMMARY OF THE INVENTION

The invention is based on the object of improving the coupling-out efficiency for light in a top emitting, electroluminescent component of the generic type. This object is achieved in a surprisingly simple manner in terms of a device just by means of a component having the features of claim 1. In this case, the top emitting electroluminescent component according to the invention, which may be formed in particular as an organic light-emitting diode device, comprises a substrate, a first electrode nearest to the substrate, a second, transparent electrode located at a distance from the substrate, and at least one organic layer arranged between the two electrodes, at least one of the organic layers being a light-emitting layer. The component is distinguished according to the invention by virtue of the fact that a coupling-out layer is arranged on that side of the second electrode which is remote from the at least one organic layer, said coupling-out layer comprising frequency conversion centres which partly absorb the light emitted in the at least one organic layer and emit it again with an altered frequency.

The invention's configuration of the top emitting, electroluminescent component enables the coupling-out efficiency thereof to be increased by more than 100%, depending on the specific embodiment, in comparison with the conventional configuration of such a component without a coupling-out layer. Furthermore, the coupling-out layer can also perform even further functions besides the function specified.

The invention is based on the idea, with the provision of a coupling-out layer on that side of the second electrode which is remote from the organic layer or layers, of influencing the propagation of the optical modes within the organic layers and the transparent electrode such that the coupling-out efficiency is increased. For this purpose, conversion centres are provided in the coupling-out layer, which conversion centres partly absorb the light emitted by the at least one organic layer and emit it again with an altered frequency. In this way, directional light penetrating into the coupling-out layer is emitted again in non-directional fashion, so that a part of the light which would be captured by means of total reflection without the influence of the frequency conversion centres within the coupling-out layer can indeed leave the coupling-out layer.

According to the invention, the coupling-out layer comprising frequency conversion centres is thus designed for reducing total reflection within the component. Although this is accompanied by a change in the frequency of the light, this can be tolerated in many applications for top emitting, electroluminescent components. This applies both to monochrome or multi-chrome displays configured according to the invention and to illumination components designed according to the invention.

Advantageous embodiments are specified in the subclaims.

Depending on the embodiment, the coupling-out layer may bear directly on the second electrode or be connected to the latter, but may also be spaced apart from the latter at least in sections. If the coupling-out layer and the transparent electrode form a common interface, or are connected to one another, this results in a particularly effective coupling of the organic modes into the coupling-out layer. In specific applications, however, it may also be expedient if the coupling-out layer is spaced apart from the second electrode at least in sections, but the distance should be less than approximately the wavelength of the light emitted by the at least one organic layer.

It may be expedient if the coupling-out layer comprises a matrix, in particular for the purpose of applying the coupling-out layer a matrix that can be brought into solution, in which the frequency conversion centres are introduced. The coupling-out layer may be formed exclusively by the matrix, and the frequency conversion centres introduced therein. Said matrix may comprise in particular a photoresist in which the frequency conversion centres are embedded. Ultimately, the matrix is not restricted to organic materials but rather may also comprise or be formed from inorganic substances.

In principle, all substances which, through absorption and reemission of light, are able to transform directional light into non-directional light can be used as frequency conversion centres in the coupling-out layer. As the person skilled in the art is aware, the frequency change in this case is a side effect that has to be accepted since the physical principle of the conservation of energy applies to the operation described. In this respect, the light can be emitted by the frequency conversion centres only with a lower frequency. With regard to a least possible loss of energy, it is particularly advantageous in this case if the energy levels of the frequency conversion centres are configured in such a way that the frequency difference between the absorbed light and the emitted light is the smallest possible, for example less than 100 nm. It is particularly expedient if said difference is less than 30 nm. By specifically setting the emission spectrum of the frequency conversion centres, it is possible to bring about a specific colour impression in the case of the component according to the invention.

It should be pointed out that, depending on the embodiment, the frequency conversion centres may have a discrete absorption level and a discrete emission level; on the other hand, it may also be the case that the centres absorb or emit over a predetermined frequency range, for example a few to several tens of nanometers.

It may be expedient if the frequency conversion centres are provided by at least one dye or a dye mixture. This may have both an organic and an inorganic construction. Typical dimensions of dye molecules lie between 1 Å and 2 nm.

By way of the setting of the dye concentration, it is possible to set the quantity of the frequency conversion and thus the extent of the directional conversion of the light in the coupling-out layer. The inventors have found a dye concentration of less than 1% by volume to be particularly expedient. This makes it possible to achieve a situation in which, although a certain part of the otherwise totally reflected light is directionally converted within the coupling-out layer, a predominant part of the light emitted by the at least one active organic layer is not absorbed by the frequency conversion centres. This last would have the consequence of further reducing the degree of coupling-out of the entire component through the coupling-out layer, which is undesirable. In this respect, according to the invention, the essential parameters of the coupling-out layer such as, in particular, dye substance, concentration, light absorption and coupling-out layer thickness are to be coordinated with one another in such a way as to produce an increased degree of coupling-out.

Expediently, the thickness of the second electrode may be less than 200 nm, in particular less than 80 nm, thus resulting in a particularly effective coupling of the light from the organic portion into the coupling-out layer since the evanescent field is not greatly attenuated by the second electrode. In this case, the refractive index of the coupling-out layer may advantageously be established to be greater than the refractive index of the nearest organic layer arranged between the electrodes. It is particularly advantageous if the thickness of the second electrode is even smaller, in particular approximately 40 nm.

In order to avoid a total reflection of the light at the interface between the second electrode and the coupling-out layer if the light enters the coupling-out layer from the electrode, it may be provided that the refractive index of the coupling-out layer is greater than the refractive index of the second electrode. In this case, it may be expedient if the refractive index of the coupling-out layer lies between 1.3 and 2.3, in particular between 1.6 and 2.0. As a result, the organic modes are completely or substantially coupled into the coupling-out layer.

In principle, it may be stated that top emitting, electroluminescent components may also be equipped with the coupling-out layer according to the invention if they have a plurality of organic layers. As specified in particular in the published German patent application DE 102 15 210 A1, it may be advantageous if, besides the light-emitting organic layer, other organic layers are also arranged between the two electrodes. In the case of a non-inverted construction, such a general structure of a component has the following layers:
1. substrate,
2. first electrode, hole-injecting anode,
3. p-doped, hole-injecting and transporting layer,
4. thin hole-side intermediate layer made of a material whose energy level of the HOMO (highest occupied molecule orbital) matches the energy levels of the HOMOs of the layers surrounding it;
5. light-emitting layer,
6. thin electron-side intermediate layer made of a material whose energy level of the LUMO (lowest unoccupied molecule orbital) matches the energy levels of the LUMOs of the layers surrounding it,
7. n-doped electron-injecting and transporting layer,
8. second electrode, electron-injecting cathode.

In the case of an inverting construction of the component, the following layers result:
1. substrate,
2.a) first electrode, electron-injecting cathode,
3.a) n-doped, electron-injecting and transporting layer,
4.a) thin electron-side intermediate layer made of a material whose energy level of the LUMO (lowest unoccupied molecule orbital) matches the energy levels of the LUMOs of the layers surrounding it,
5.a) a light-emitting layer,
6.a) thin hole-side intermediate layer made of a material whose energy level of the HOMO (highest occupied molecule orbital) matches the energy levels of the HOMOs of the layers surrounding it,
7.a) p-doped hole-injecting and transporting layer,
8.a) second electrode, hole-injecting anode.

According to the invention, then, provision is made of an additional layer—designated as coupling-out layer—for increasing the degree of coupling-out.

As specified in the published patent application DE 102 15 210 A1, the hole transport layer may be p-doped with an acceptor like organic material and the electron transport layer may be n-doped with a donor like organic material.

The inventors of the present invention have additionally found that the electron transport layer may also be n-doped with an alkali metal. These configurations result in an increased conductivity, so that the transport layers may have higher layer thicknesses than usual in comparison with undoped layers (typically 20 to 40 nm) without the operating voltage being drastically increased. In this respect, in the case of a non-inverted construction of the component according to the invention, it may be expedient if a further organic layer is arranged between the coupling-out layer and the emitting organic layer, which further organic layer is an electron transport layer that is n-doped with a donor like organic material and has a thickness of between 20 nm and 2 µm, in particular a thickness of between 30 nm and 300 nm. In the case of an inverted construction of the component, said further organic layer is a hole transport layer that is p-doped with an acceptor like organic material and has a thickness of between 20 nm and 2 µm, in particular a thickness of between 30 nm and 300 nm. It goes without saying that, in accordance with the above-specified general structure of a component according to the invention, another electrode and also, under certain circumstances, a block layer are furthermore arranged between the coupling-out layer and the emitting organic layer.

For the sake of completeness, it should be pointed out that, depending on the embodiment of the component according to the invention, an inverting or respectively non-inverting design may not encompass all of the layer types specified above, furthermore provision may also be made, however, of other layers such as, for example, a thin (less than 10 nm) contact-enhancing layer between the electron transport layer and the cathode and/or between the anode and the hole transport layer. For the subsequent process steps, in particular for the application of the coupling-out layer in a manner adjoining the second electrode or adjacent to the latter, it may be favourable to provide a thick doped charge transport layer between the light-emitting organic layer and the coupling-out layer, which represents a protection for the light-emitting layer during the production of the coupling-out layer.

Expediently, the coupling-out layer has a thickness of between 0.05 µm and 1000 µm, in particular between 0.5 µm and 100 µm.

It may be expedient if the coupling-out layer is configured in such a way that it not only increases the light coupling-out efficiency, but also simultaneously represents a protection for the layers arranged between the electrodes against mechanical loading, electromagnetic radiation, particle radiation, moisture, air and/or chemical influences. In this way, the coupling-out layer additionally affords an encapsulation or protection function, which is advantageous particularly in the case of display and illumination applications.

The inventors have found that it is expedient if the transmittance of the coupling-out layer at the wavelength of the light emitted by the at least one organic layer is greater than 0.4 and the transmittance of the coupling-out layer at the wavelength of the light emitted by the frequency conversion centres is greater that 0.6. In this case, the transmittance $\tau$ of the coupling-out layer is determined according to the relevant formula $\tau = e^{-(\alpha d)}$, where $\alpha$ specifies the absorption coefficient and d specifies the thickness of the coupling-out layer. Setting the described parameters of the coupling-out layer ultimately has the effect of producing an optimized additional coupling-out of light energy.

In terms of a method, the invention achieves the above object by means of a method for producing a top emitting, electroluminescent component, designed in particular as an organic light-emitting diode device, having the steps of:
provingding a substrate,
applying a first electrode nearest to the substrate,
applying at least one light-emitting organic layer,
applying a second, transparent electrode located at a distance from the substrate, and
applying a coupling-out layer comprising frequency conversion centres on that side of the second electrode which is remote from the at least one organic layer.

This coupling-out layer may be fashioned by means of one or more of the known techniques for applying thin layers. In particular, the coupling-out layer may be applied wet-chemically to the second electrode. In this case, the coupling-out layer may be formed from a matrix material and mixed with the frequency conversion centres, the mixture being applied wet-chemically. For the purposes of processing, a solvent can be added to the matrix material. Said solvent may on the one hand serve for the purposes of wet-chemical application of the coupling-out layer or only enable the frequency conversion centres to be mixed with the matrix material. Moreover, it is also possible to provide a dispersant for mixing the frequency conversion centres with the matrix material.

It is particularly advantageous to use a positive photoresist as matrix material, which is dissolved in a corresponding solvent and mixed with a dye, the mixture being applied to the transparent electrode by means of a spin- or roller-coating method, by way of example.

A method for applying the coupling-out layer which is particularly advantageous because it is simple to carry out and is gentle on the component according to the invention consists in processing a film that is laminated or adhesively bonded onto the second electrode, the film being provided with the frequency conversion centres.

Furthermore, the coupling-out layer may also be applied by means of a thermal vapour deposition method. In this case, it may be advantageous if the matrix material and the substance comprising the frequency conversion centres are vapour-deposited in a thermal co-vapour deposition method in the gas phase.

As already explained above, a transport layer having a thickness of between 30 nm and 300 nm and comprising an organic doping or an alkali metal may advantageously be applied, so that the coupling-out layer can subsequently be applied to the top thin contact layer (trans-parent electrode) wet-chemically or by thermal vapour deposition without damaging the light-emitting organic layer.

DESCRIPTION OF PREFERRED
EMBODIMENTS OF THE INVENTION

Figure 2:
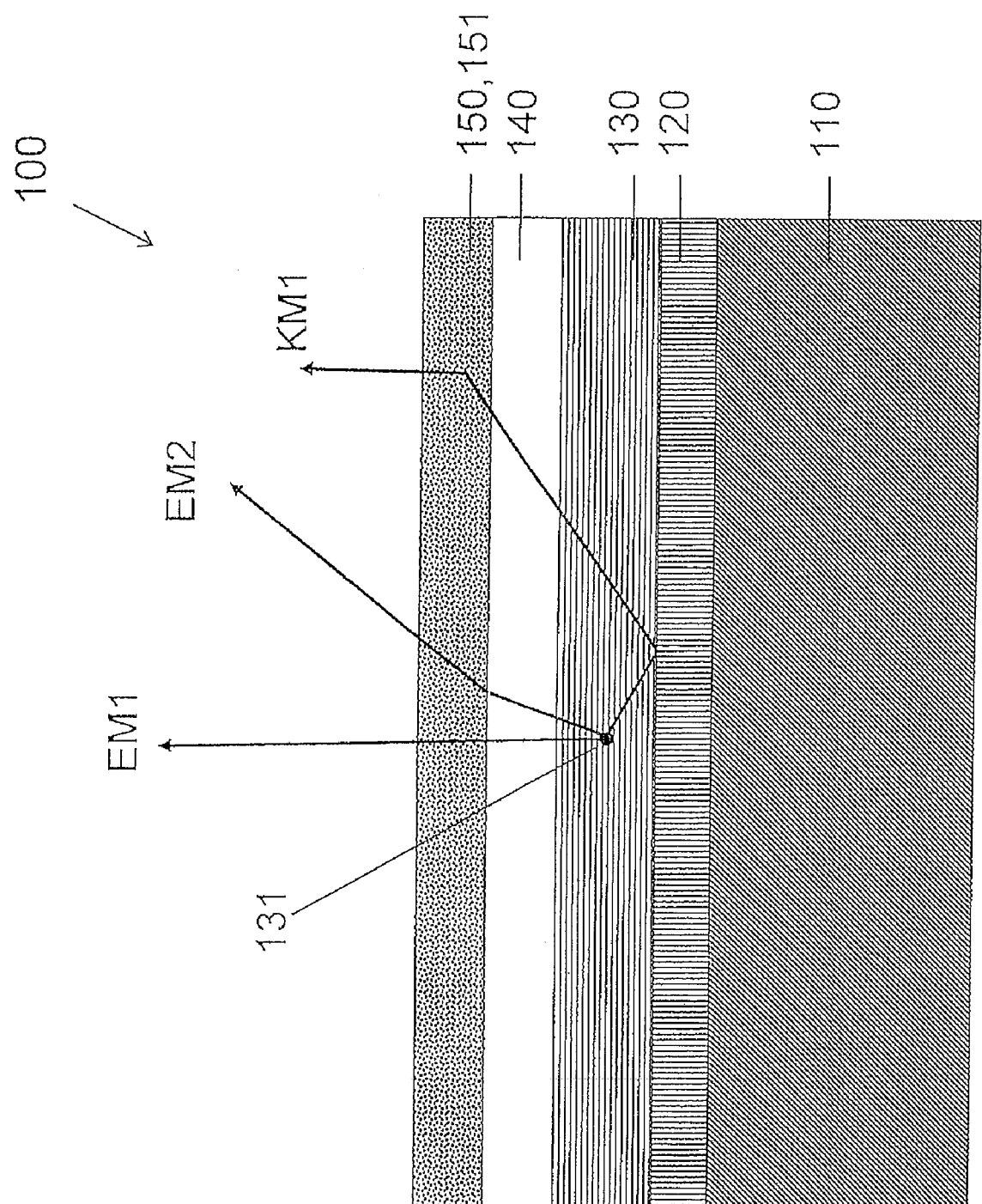

The invention is explained below by the description of a plurality of embodiments with reference to the accompanying Fig., in which
FIG. 1 shows a conventional top emitting OLED in a schematic illustration,
FIG. 2 shows a top emitting OLED designed according to the invention in accordance with a first embodiment in a schematic illustration.

FIG. 1 shows a schematic sketch of the construction of a conventional electroluminescent, top emitting component 100. In the example specified, the electrode 120 nearest to the substrate 110, which electrode is designated hereinafter as first electrode, is embodied as a reflective metal layer. A plurality of organic layers, specified as organic layer structure 130 in the Fig., are applied to the first electrode. Said layer structure comprises at least one organic electroluminescent layer. The layer structure 130 is adjoined by a second electrode 140 composed of a transparent material, for example a conductive oxide.

When a voltage is applied between the two electrodes, charge carriers, that is to say electrons from one side and holes from the other side, are injected from the contacts into the organic layers situated in between, whereupon electron-hole pairs form in the active zone, which recombine with emission of light. An exemplary emission point is designated by the numeral 131 in the Fig. The light propagates proceeding from this emission location, this being indicated by individual arrows in the Fig. As can be discerned, a reflection of the light and/or a transmission into the next layer is effected at the interfaces between two layers. The light which remains (beam OM1) within the component, here within the layer structure 130 and/or the electrode 140, is referred to as the organic mode, and the light which leaves the component (beams EM1, EM2) is referred to as external modes. Since even the organic layers have an absorption coefficient not equal to zero for the light generated within the layers, said light is absorbed in the course of propagation in the longitudinal direction with respect to the layer.

The invention then commences here with a particular configuration of the component in order to increase the coupling-out efficiency in the case of a top emitting component. For this purpose, in one embodiment, a coupling-out layer having frequency conversion centres is provided directly on the second electrode. Such an embodiment is illustrated in a schematic sketch in FIG. 2. Since the number of organic layers that emit light by means of electroluminescence is of secondary importance to the present invention, these layers are actually only specified as layer structure 130 in FIG. 2. An electrode 120 is applied to the substrate 110, said electrode being adjoined by the organic layer structure 130, in which the light is generated. This is adjoined by the second electrode 140, to which an additional layer, the coupling-out layer 150, is applied according to the invention. The latter layer has frequency conversion centres 151.

The component according to the invention as illustrated in FIG. 2 can be produced in different ways, depending on the specific embodiment. In one kind of embodiment, the coupling-out layer is applied wet-chemically by means of a printing method (inkjet printing, screen printing, flexographic printing, pad printing and further relief printing, intaglio printing, planographic and screen process printing methods), or blade coating, spin-coating, dip-coating, roll-coating, spraying, etc. Prior to the application, a dye for example, in particular a laser dye, may in turn be admixed depending on the embodiment.

Depending on the embodiment, e.g. one or more of the following materials is or are used for the coupling-out layer, said materials being present as solution, emulsion and/or dispersion during processing, depending on the application method utilized. After application to the component, these materials form the matrix of the coupling-out layer, e.g. by means of the evaporation of the solvent or by optical curing:
Polymer solutions such as e.g. solutions of polyfluorenes or polystyrenes in organic liquids, e.g. aromatic solvents, such as xylene, toluene, anisole, trimethylbenzene and the like.

solutions of organic non-polymeric layer-forming materials such as solutions of organic glasses, e.g. ortho-terphenyl or 1,3,5-tri-alpha-naphtyl-benzene in aromatic solvents, e.g. xylene, a monomer or a mixture of monomers which polymerise after application, such as methyl methacrylates or allyl diglycol carbonate or derivatives thereof which are polymerized thermally, chemically or in a photo initiated manner after application, a monomer or a mixture of monomers which are linked by polyaddition after application, e.g. polycarbonates, optical adhesives, photoresist, transparent or semitransparent adhesives such as chemically curing adhesives (e.g. 2-component adhesives), thermally curing adhesives (e.g. acrylates, epoxy resins) or UV-curing adhesives such as acrylates or epoxy resins, transparent thermoplastics such as low density polyethylene, polycarbonates and polyurethanes, thermosetting plastics such as phenolic resins or melamine resins, emulsions such as aqueous or organic or fluoro-organic emulsions comprising e.g. polyacrylate, polyvinyl alcohol or polyvinyl acetate, clear coatings such as alkyd resin coatings, nitro and nitro combination coatings, two-component coatings such as polyurethane coatings, water-dilutable coatings, synthetic resin coatings and acrylate coatings, collagenic proteins such as gelatine, cellophane or celluloid, dispersions such as polymer dispersions (e.g. titanium dioxide particles and polyvinyl acetate in water) and solutions or dispersions comprising inorganic materials such as salt solutions.

Depending on the matrix material used, frequency conversion centres adapted thereto are introduced into the matrix material. Such centres have characteristic absorption bands and emission bands and may have both an inorganic and an organic structure. In this respect, the suitable frequency conversion centre material may be selected in a manner tailored to the emission spectrum of the electroluminescent material used and the matrix material used.

Organic or inorganic dyes or else inorganic microcrystals may be used as frequency conversion centres, Exemplary organic dyes are:

many known laser dyes, e.g. nile blue, cresyl violet, sulforhodamine B, rhodamine B, fluorescein 548, coumarins,

DCJTB, DCM many emitters known from OLEDs, e.g. 1,4-bis(9-ethyl-3-carbazovinylene)-9,9-dihexylfluorene; 4,4'-bis(9-ethyl-3-carbazovinylene)-1,1'-biphenyl; Alq3

Exemplary inorganic microcrystals are:

microcrystals of suitable phosphors microcrystals of fluorescent emitters such as ZnSe, ZnS In terms of the method, in the case of the component 100 illustrated in FIG. 2, proceeding from a substrate 110 comprising a flexible, non-transparent plastics material, a first metal electrode 120 is vapour-deposited and patterned. Afterwards, an organic layer structure made of $Alq_3$ as electroluminescent material is processed on in a conventional manner. A transparent electrode made of a TCO material is in turn applied thereon. Finally, the co-vaporization of silicon dioxide and rubrene is effected, rubrene being vapour-deposited in a concentration of 1% by volume.

The light generated in the organic layer structure 130 leaves the component only via the coupling-out layer 150 since the bottom electrode 120 and the substrate 110 are not transparent. The refractive index of the coupling-out layer, with a value of 2.0, is slightly higher than the index of the organic layer structure 130 and of the electrode 140. In this respect, a significant part of the light that is otherwise captured as an organic mode in the optical layer structure and the electrode 140 is coupled-out into the layer 150. A part of the electroluminescent light in the coupling-out layer can leave the latter towards the top, see the beams EM1 and EM2 in FIG. 2. On account of the—in comparison with air—high refractive index of 2.0, however, total reflection occurs at the air/coupling-out layer interface for a part of the light from the organic layer structure. This part of the light is reflected back and forth within the coupling-out layer between the interfaces. In the course of these reflections, the light also impinges on the dye centres 151 arranged in the coupling-out layer. These absorb the electroluminescent light and emit the energy again through the emission of light with a slightly lower frequency. What is crucial for the invention here is that the absorbed light was directional, while the dye molecules emit photons again in non-directional fashion. What is achieved in this way is that at least a part of the light that is otherwise captured in the coupling-out layer 150 is emitted by the colour centres 151 in directions in which no total reflection occurs, see the beam KM1 in FIG. 2. Consequently, the component according to the invention emits both primary light as electroluminescent light and secondary light that has been emitted by the frequency conversion centres. This increases the efficiency of the component according to the invention. The ratio of secondary light to primary light may be between 11:1 and 1:20, for example depending on the embodiment.

A top emitting component of this type can be used e.g. as an illumination element with an increased efficiency.

A further class of top emitting electroluminescent components according to the invention is produced by applying the coupling-out layer by co-vaporization, in particular thermal co-vaporization of matrix material and conversion centre material. When using this method, which is presented only by way of example) the following matrix materials, in particular, are used:

organic layers, such as e.g. monomers, which are vapour-deposited and subsequently polymerized, such as methyl methacrylate (MMA), acrylic acid, organic layers comprising small molecules such as aromatics, aliphatics, heterocyclic compounds, ketones; for example tetrakis-diphenylaminospirobifluorene (spiro-TAD), triscarbazolyltriphenylamine (TCTA), bathophenanthroline (Bphen).

Most of these materials presented for the coupling-out layer are distinguished not only by their transparency in the visible spectral range but also by a refractive index that is greater than or equal to that of the electroluminescent layer structure. In this respect, the light generated in the active organic layer is coupled particularly effectively from the organic layers into the coupling-out layer of the component according to the invention and is coupled out fi-m there through the colour centres specified out of the structure. Since most of these materials of the coupling-out layer, although they are transparent in the visible spectral range, are highly absorbent in the UV range, such coupling-out layers afford the organic layers not only protection against moisture and air but also against UV radiation.

LIST OF REFERENCE SYMBOLS

100 OLED component
110 Substrate
120 First electrode
130 Organic layer/layer structure
131 Emission point
140 Second electrode
150 Coupling-out layer
151 Conversion centres
EM1, EM2 External mode
OM1 Organic mode
KM1 Converted light

The invention claimed is:

1. Top emitting, electroluminescent component comprising a substrate, a first electrode closest to the substrate, a second, transparent electrode located at a distance from the substrate, and at least one organic layer arranged between the two electrodes, wherein at least one of the organic layers is a light-emitting layer, and wherein a coupling-out layer designed for improving the coupling-out of light is arranged on that side of the second electrode which is remote from the at least one organic layer, said coupling-out layer comprising frequency conversion centers which partly absorb the light emitted in the at least one organic layer and emit it again with an altered frequency, wherein the coupling-out layer is an organic matrix in which the frequency conversion centers are provided, wherein the frequency conversion centers are provided by at least one dye, wherein the dye concentration in the coupling-out layer is less than 1% by volume, wherein the transmittance degree of the coupling-out layer at the wavelength of the light emitted by the at least one organic layer is greater than 0.4 and the transmittance of the coupling-out layer at the wavelength of the light emitted by the frequency conversion centers is greater than 0.6.

2. Component according to claim 1, wherein the coupling-out layer is on the second electrode and is connected to the latter.

3. Component according to claim 1, wherein the coupling-out layer is at a distance from the second electrode, the distance being less than 500 nm.

4. Component according to claim 1, wherein the dye has dye molecules having a dimension of between 1 Å and 2 nm.

5. Component according to claim 1, wherein the dye is an organic dye.

6. Component according to claim 1, wherein the light emitted by the frequency conversion centers is frequency-shifted to a lower frequency with respect to the light absorbed by the centers, the energy levels of the frequency conversion centers being configured in such a way that the frequency difference between the absorbed light and the emitted light is less than 30 nm.

7. Component according to claim 1, wherein the thickness of the second electrode is less than 80 nm, and the refractive index of the coupling-out layer is greater than or equal to the refractive index of the nearest organic layer arranged between the electrodes.

8. Component according to claim 1, wherein the refractive index of the coupling-out layer is greater than or equal to the refractive index of the second electrode.

9. Component according to claim 1, wherein the refractive index of the coupling-out layer lies between 1.6 and 2.0.

10. Component according to claim 1, wherein the organic layer that is arranged between the electrodes and is nearest to the coupling-out layer is a hole transport layer which is p-doped with an acceptor like organic material and has a thickness of between 30 nm and 300 nm.

11. Component according to claim 1, wherein the organic layer that is arranged between the electrodes and is nearest to the coupling-out layer is an electron transport layer which is n-doped with a donor like organic material and has a thickness of between 30 nm and 300 nm.

12. Component according to claim 1, wherein the organic layer that is arranged between the electrodes and is nearest to the coupling-out layer is an electron transport layer which is n-doped with an alkali metal and has a thickness of between 30 nm and 300 nm.

13. Component according to claim 1, wherein the coupling-out layer has a thickness of between 0.5 µm and 100 µm.

14. Component according to claim 1, wherein the coupling-out layer is constructed in such a way that it represents a protection for the layers arranged between the electrodes and the electrodes themselves against mechanical loads, electromagnetic radiations, particle radiation such as α/β radiation, moisture, air and/or chemical influences.

* * * * *